US005770914A

United States Patent [19]

Pease et al.

[11] Patent Number: 5,770,914

[45] Date of Patent: Jun. 23, 1998

[54] ILLUMINATED PIEZOELECTRIC SWITCH

[75] Inventors: Logan L. Pease; Raymond G. Bryan, both of Reno, Nev.

[73] Assignee: International Game Technology, Reno, Nev.

[21] Appl. No.: 884,428

[22] Filed: Jun. 27, 1997

Related U.S. Application Data

[63] Continuation of Ser. No. 401,875, Mar. 10, 1995, abandoned.

[51] Int. Cl.[6] .......... H01L 41/08

[52] U.S. Cl. .......... 310/339; 310/319; 310/800

[58] Field of Search .......... 310/338, 339, 310/319, 800; 200/181

[56] References Cited

U.S. PATENT DOCUMENTS

| | | | |
|---|---|---|---|
| Re. 32,180 | 6/1986 | Lewiner et al. | 340/573 |
| 3,604,958 | 9/1971 | Palini | 310/319 |
| 3,609,723 | 9/1971 | Alstad | 340/174.1 M |
| 3,699,296 | 10/1972 | Harris | 200/67 DB |
| 3,701,903 | 10/1972 | Merhar | 310/319 X |
| 3,760,402 | 9/1973 | Mayerle et al. | 310/319 X |
| 3,900,830 | 8/1975 | Peterson | 310/319 X |
| 3,935,485 | 1/1976 | Yoshida et al. | 310/800 |
| 4,065,677 | 12/1977 | Micheron et al. | 307/112 |
| 4,158,117 | 6/1979 | Quilliam et al. | 200/181 |
| 4,343,975 | 8/1982 | Sado | 200/314 |
| 4,430,595 | 2/1984 | Nakasone et al. | 310/339 |
| 4,490,639 | 12/1984 | Echols et al. | 310/319 |
| 4,516,112 | 5/1985 | Chen | 340/365 R |
| 4,555,953 | 12/1985 | Dario et al. | 73/862.04 |
| 4,600,851 | 7/1986 | Isayama et al. | 310/324 |
| 4,665,754 | 5/1987 | Glenn et al. | 73/727 |
| 4,734,609 | 3/1988 | Jasmine | 310/319 X |
| 4,868,566 | 9/1989 | Strobel et al. | 310/339 X |
| 4,896,069 | 1/1990 | Rosenberg et al. | 310/339 |
| 5,034,648 | 7/1991 | Gastgeb | 310/319 X |
| 5,142,183 | 8/1992 | Burgess et al. | 310/339 |
| 5,170,087 | 12/1992 | Karr et al. | 310/319 |
| 5,216,316 | 6/1993 | Ipcinski | 310/338 |
| 5,231,326 | 7/1993 | Echols | 310/339 |
| 5,332,944 | 7/1994 | Cline | 310/339 |
| 5,442,150 | 8/1995 | Ipcinski | 200/181 |

FOREIGN PATENT DOCUMENTS

| | | | |
|---|---|---|---|
| 2618720 | 11/1976 | Germany | H03K 17/00 |
| 0582511 | 11/1977 | U.S.S.R. | G06F 3/02 |

*Primary Examiner*—Mark O. Budd
*Attorney, Agent, or Firm*—Sheridan Ross

[57] ABSTRACT

An illuminated switch assembly employs a piezoelectric film as both a transducer and a circuit substrate. Preferably some or all of the transducer portion of the film is light transmissive in order to facilitate illumination of the activation surface of the switch. Use of a piezoelectric film provides the ability to reduce or eliminate relatively moving parts, resulting in an increase of the useful life of the switch. Providing conductive traces, interconnection and circuitry mounted directly on the piezoelectric film reduces the need for interconnecting a number of different parts during assembly and/or manufacture and thus reduces the cost of the switch.

20 Claims, 4 Drawing Sheets

4A
46
24
28
48
4A

FIG. 1
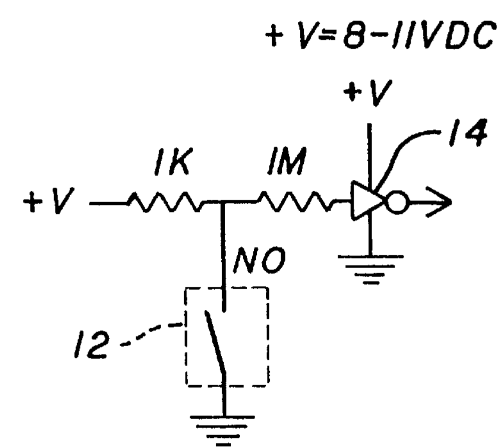
FIG. 2
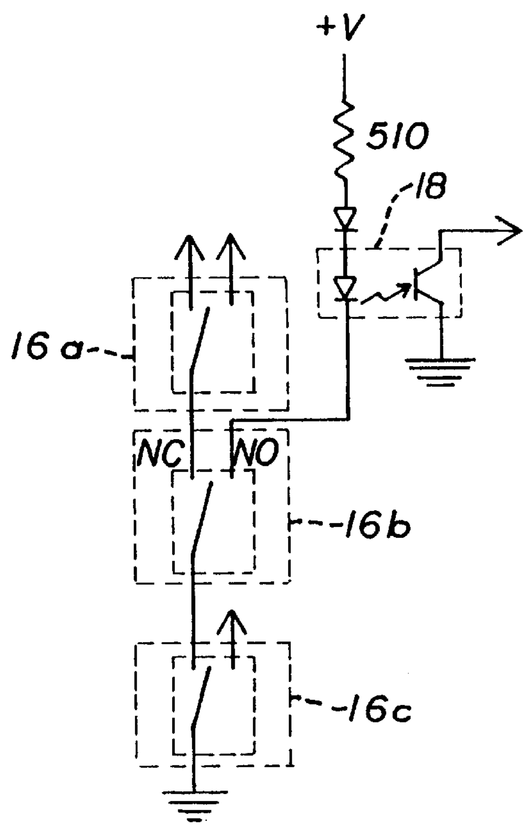
FIG. 5
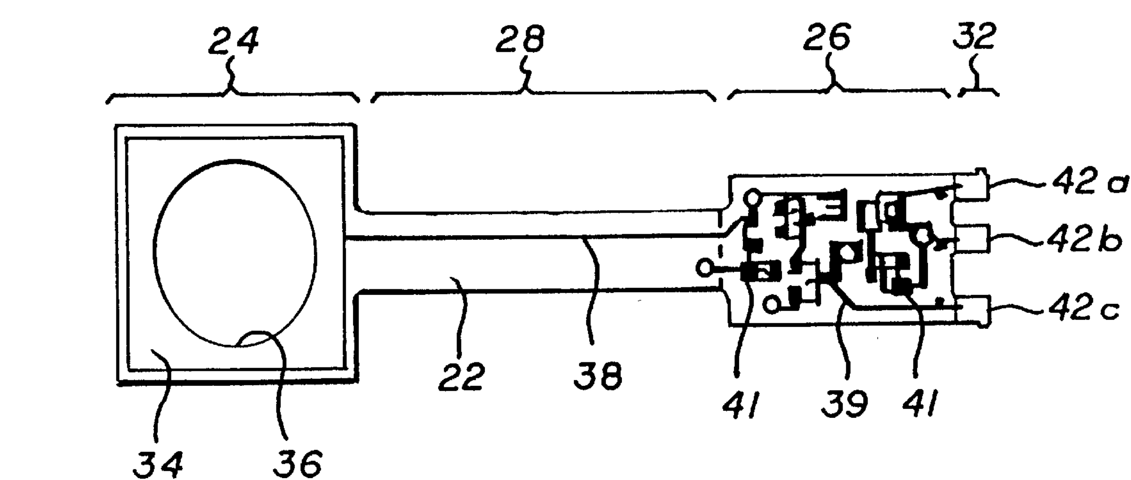
FIG. 3

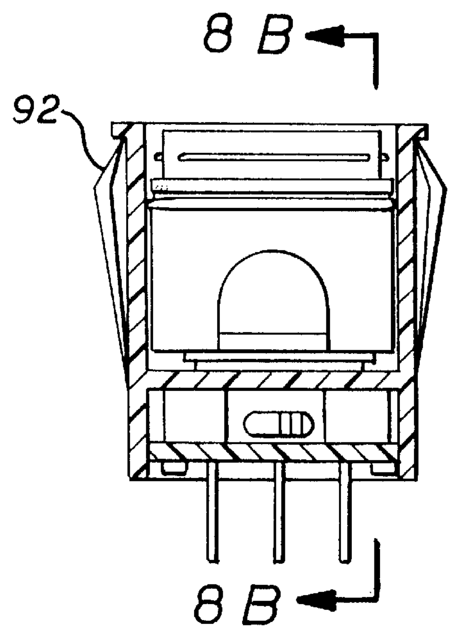
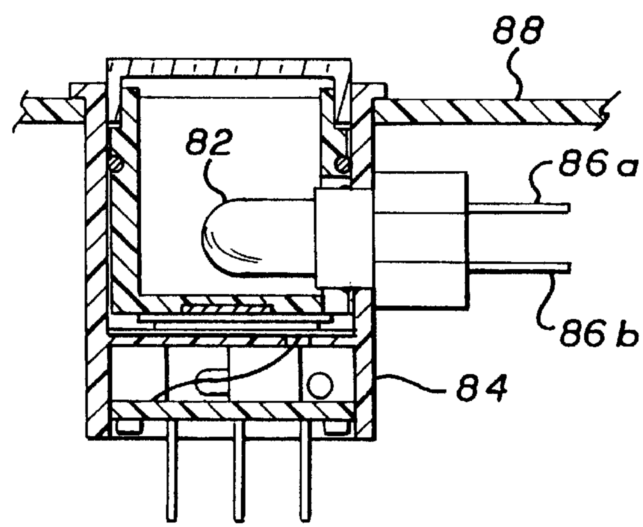
FIG. 8A
FIG. 8B
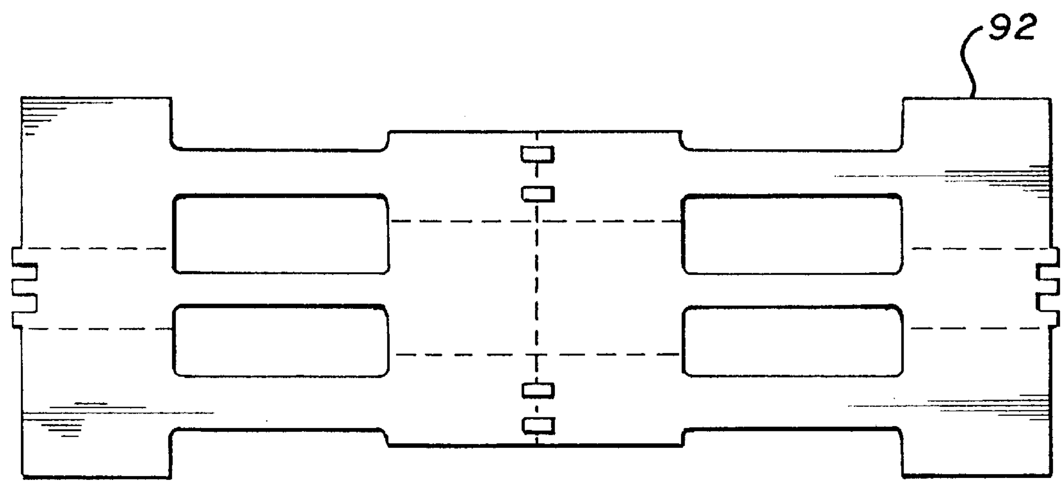
FIG. 9

ILLUMINATED PIEZOELECTRIC SWITCH

This is a continuation of application Ser. No. 08/401,875, filed on Mar. 10, 1995 now abandoned.

The present invention relates to a switch and in particular to a switch having a piezoelectric film which is at least partially transparent, to facilitate switch illumination.

BACKGROUND INFORMATION

A number of devices make use of illuminated switches, preferably being internally illuminated, such that the surface which the user is to push or to otherwise activate is backlit. Often the backlit activation area will have lettering or other indicia, e.g., to inform the user of the switch's function.

In those contexts in which the cost of such a switch is a concern, such as switches for mass-produced objects, illumination was commonly achieved by using a mechanical switching apparatus in which the switching function was achieved by a process that included the relative motion (e.g., sliding motion or rotational motion) of one part of the switch with respect to another. Although such a configuration was often consistent with a goal of providing a low-cost switch, mechanical switching has been found to be subject to early failure so that the low cost is at least partially offset by the high cost of maintaining and/or replacing failed switches.

Although illuminated switches have application in a broad range of devices including, for example, control devices for consumer home products, computing equipment, vehicles or machinery, one illustrative example of a use of such switches is in gaming devices such as switches provided in electronic or partially-electronic slot machines or other gaming devices to permit the user to control the operation of the device. It has been found that, in this context, mechanical switching is particularly prone to early failure because of the exposure of such switches to contaminants such as spilled beverages or other food products, smoke and the like.

Another type of switch reduces or eliminates mechanical switching by using one or more piezoelectric components which generate an electric charge in response to a strain on the film such as produced from a deformation, often in response to very slight deformation. This charge can then be used to control or activate a switch. Piezoelectric switches have, generally, been inconsistent with a goal of producing low cost switches. The cost of piezoelectric switching devices in the past has been at least partially a function of the need to provide a multitude of different parts to the switch including the piezoelectric material, the switching devices that react to a change in charge and devices for transmitting the charge to the switching devices. Switches having a number of components tend to be high cost not only because of the cost of the individual components but also because of the cost of assembling the various components into the final switch assembly.

Accordingly, it would be advantageous to provide a switching device which has increased reliability and robustness, e.g. by reducing or eliminating the need for relative motion between two or more components while providing low cost illuminated switches.

SUMMARY OF THE INVENTION

The present invention provides a low cost illuminated switch having a piezoelectric film which is at least partially light transmissive or transparent. The light-transmissive characteristic of the film is useful because the portion of the film which acts as a transducer (i.e., which generates a charge) can be placed in the immediate vicinity of the activation area of the switch without substantially blocking the internal switch illumination. According to one embodiment of the invention the piezoelectric film not only has a first area which acts as the charge-generating area but also has a second area which acts as a substrate for attaching switching components (such as transistors) directly to the piezoelectric film, and preferably, further has devices (such as conductive lines) for conveying the charge generated in the transducer portion of the film to the switching devices, with the conductive traces being placed directly on the piezoelectric film. The combining of the piezoelectric transducer, the substrate for holding the transducers or other switch components and the conductive traces connecting the transducer to the switch devices aids in producing a switch assembly which is low cost and easy to manufacture. Preferably, the piezoelectric film also includes conductive traces for connecting the switching devices to conductive plugs or other electrical connectors. In one embodiment the plugs or electric connectors extend substantially through a housing enclosing the switch assembly. Preferably the housing and plug configuration are made to have an external shape substantially similar to that of previous switches, such as previous mechanical switches, in order that mechanical switches can be easily replaced by the present invention without the need for substantial redesign of other components.

BRIEF DESCRIPTION OF THE DRAWINGS

FIG. 1 is a block schematic depiction of a first circuit having a single pole single throw, normally open switch;

FIG. 2 is a schematic block diagram of a circuit having a single pole double throw switch;

FIG. 3 is a top plan view of a piezoelectric film and adjacent leads and circuitry;

FIG. 5 is a schematic depiction of a switch assembly according to one embodiment of the present invention;

FIG. 8A is a cross-sectional view of a switch assembly according to one embodiment of the present invention;

FIG. 8B is a cross-sectional view taken along line 8B—8B of FIG. 8A; and FIG. 9 is a partial top plan view of a sheet of piezoelectric material for use in forming switches according to an embodiment of the present invention.

DETAILED DESCRIPTION OF THE PREFERRED EMBODIMENTS

Figures 4A, 4B:
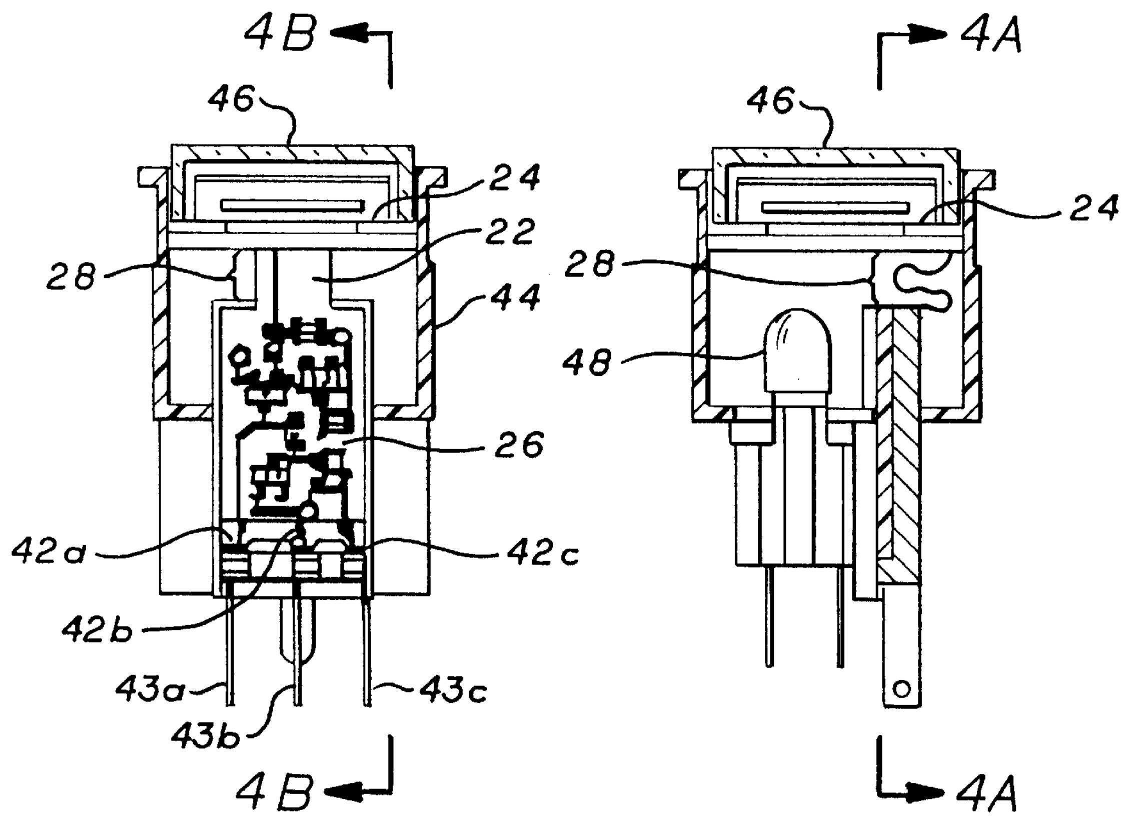
FIG. 4A is a cross-sectional view through a switch assembly according to an embodiment of the present invention.
FIG. 4B is a cross-sectional view taken along line 4B—4B of FIG. 4A.

Switches according to the present embodiment can be provided in a number of configurations including single pole single throw (SPST) and single pole double throw (SPDT) configurations. FIG. 1 depicts a first circuit having a single pole single throw normally open (SPST-NO) switch 12 whose state determines the conductive or nonconductive behavior of output device 14. FIG. 2 depicts single pole double throw (SPDT) switch devices 16*a,* 16*b,* 16*c,* where the state of switch device 16*b* controls the conductive or nonconductive behavior of output device 18. Other circuits in which switches of the present invention can be used will be apparent to those of skill in the art after understanding the present invention described herein.

According to one embodiment of the present invention, the switch assembly includes a flexible transparent piezoelectric film 22. In the embodiment depicted in FIG. 3, the film 22 includes a first transducer region 24, a second region 26, a third connective region 28 and fourth connective region 32. The piezoelectric film 22 can be a piezoelectric polymer transparent flexible film such as that described in U.S. Pat. No. 4,516,112 issued May 7, 1985 to Chen and/or film available from AMP Flexible Film Sensors of Newton, Mass.

In the depicted embodiment, the transducer region 24 has a peripheral area covered with a conductive layer such as printed conductive ink 34. In the depicted embodiment the central portion 36 of the transducer region 24 is kept clear of conductive ink or other light-blocking material in order to achieve the switch illumination described below. In another embodiment the portion of the transducer that must transmit light 36 can also be made substantially conductive by coating with a transparent metalization such as indium tin oxide (ITO). The second switch region 26 of the piezoelectric film 22 includes switch components such as solid state switch components mounted on the film 22. According to one embodiment, the components, described below, are mounted to the film using a conductive epoxy.

The third connective region 28 includes a conductive line or trace 38 connecting the transducer region 24 with components on the switch region 26 in order to convey the charge generated from deformation of the transducer region 24 to the switch region 26. In one embodiment, a trace is provided in each surface of the film 22 (with FIG. 3 depicting only one surface since the conductive ink regions and traces will be substantially similar on the opposite surface). Conductive traces and/or pads 42 are provided in the fourth conductive region 32 e.g., for connection to one or more electrical plugs (described below).

Thus it can be seen that the piezoelectric film 22 acts not only as a transducer but also as a substrate for the switch components, as a conductor of charge from the transducer to the switch components and a conductor from the switch components to the electrical plugs. Additionally, spacing and/or strengthening materials such as strips or blocks of foam material, layers of transparent sheet material and the like, cut in appropriate profiles, can be laminated to the piezoelectric film 22 e.g., to facilitate mounting in a housing as described below.

FIGS. 4A and 4B depict the mounting of the piezoelectric film in a housing 44 according to an embodiment of the present invention. In the depicted embodiment the transducer region 24 lays beneath and parallel to an activation surface 46 and can be held in place by, e.g. a potting substance. The activation surface is preferably transparent so that light generated by a light source such as incandescent bulb 48 passes through the central portion 36 of the transducer region 24 and through the transparent activation region 46 to achieve the illumination function. In one embodiment, a T-13/4 6.3 volt wedge-based incandescent bulb is used. Other illumination components can be used such as a light emitting diode (LED). In one embodiment the lettering or indicia indicating the function of the switch is applied to the activation area 46 and this nomenclature for the switch can be selected independently of the button assembly. When the user presses on the activation surface 46 pressure is transmitted to the piezoelectric transducer region 24 producing a charge which is conveyed by the traces 38 on the two surfaces to the switch region 26 for activating the switch device as described below. A number of switch characteristics can be provided. In one embodiment the switch provides a contact closure of 20 ms minimum to 300 ms maximum per actuation of 20 to 200 ms. Preferably the activation is achieved substantially in the absence of relative motion of two or more parts of the switch, such as by flexing or deformation of the piezoelectric transducer region 24. In this context, "substantially in the absence of relative motion" means that, while, in some embodiments, there may be some relative motion of parts in the switch assembly, any such relative motion is sufficiently small or sufficiently remote from exposure to the environment so as to avoid interfering with the objective of reducing or eliminating premature switch failure, particularly in environments exposed to switch contaminants. In some embodiments, there is no relative motion during switch activation.

In order to facilitate connection of the switch apparatus 26 with the electrical plugs 43*a*, 43*b*, 43*c* the second connective portion 32 includes quick connect tabs 42*a*, 42*b*, 42*c* to facilitate mechanical and electrical contact with the electrical plugs with 43*a*, 43*b*, 43*c*.

FIG. 5 depicts a first embodiment for converting the charge generated by the piezoelectric film 22 to activation of a switch. In the embodiment depicted in FIG. 5, pressure applied to the transducer portion of the piezoelectric film generates a voltage across resistor 53 sufficient to turn on a first transistor such as a metal oxide semiconductor field effect transistor (MOSFET) 52 that provides a low resistance closure of the normally open connection of the solid state switch. The turning on of the first MOSFET 52 removes voltage that was present across a second MOSFET 54 opening the normally closed connection of the solid state switch. After a brief period of time, the voltage created by the piezoelectric film dissipates and the solid state switch returns to its rest condition.

The switch assembly depicted in FIG. 5 provides a passive implementation of a normally closed switch. The switch is passive in the sense that the switch assembly itself is normally unpowered. In the embodiment of FIG. 5, in the absence of switch device 54, the switch assembly shown in FIG. 5 would be a single pole, single throw switch. If there is no voltage generated by transducer 22, transistor 52 is in the "off" state. In one contemplated use of the switch assembly of FIG. 5, the switch assembly would be configured such that, in normal use, there is a potential (but substantially no current) between the NO node and the COM node. With switch device 54 included in the circuit as depicted in FIG. 5, the voltage between node NO and node COM is across the junction of transistor 54 causing it to be "on," even though the switch assembly of FIG. 5 is itself unpowered. In this way, FIG. 5 provides a normally-closed switch even though the assembly of FIG. 5 is passive, i.e., unpowered.

In the configuration of FIG. 5, switch device 52 and switch device 54 are in a master-slave relationship such that an electric charge produced by transducer 22 causes closing of the normally-open switch 52 and this closing of switch 52, in turn, causes opening of the normally-closed switch 54. It is also possible to provide a configuration in which the normally-closed switch is the master and the opening of the normally-closed switch causes the normally-open "slave" switch to close, e.g., as depicted in FIG. 7B.

Figure 6:
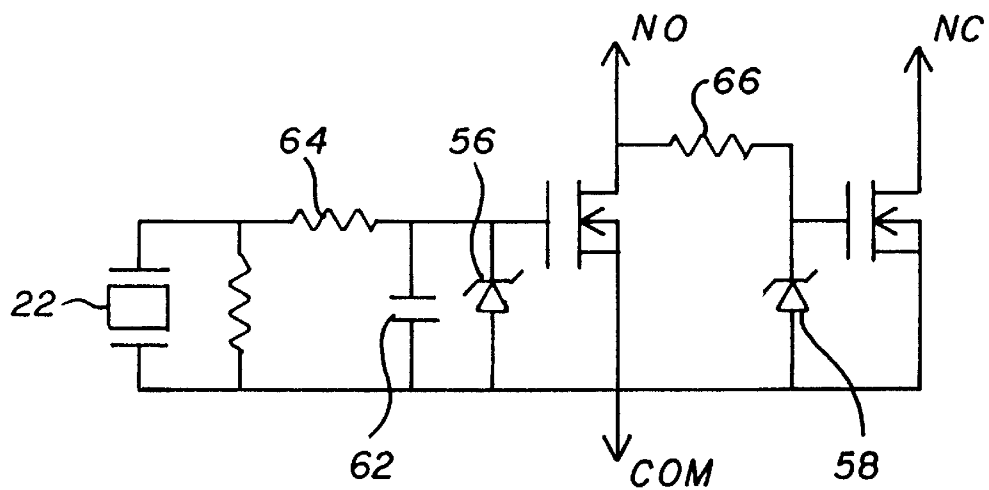
FIG. 6 is a schematic depiction of a switch assembly according to one embodiment of the present invention.

FIG. 6 depicts a switch apparatus which is generally similar to that of FIG. 5 but includes zener diodes 56, 58, capacitor 62 and resistors 64, 66 in order to provide static protection or voltage protection and low-pass filtering.

Figure 7A:
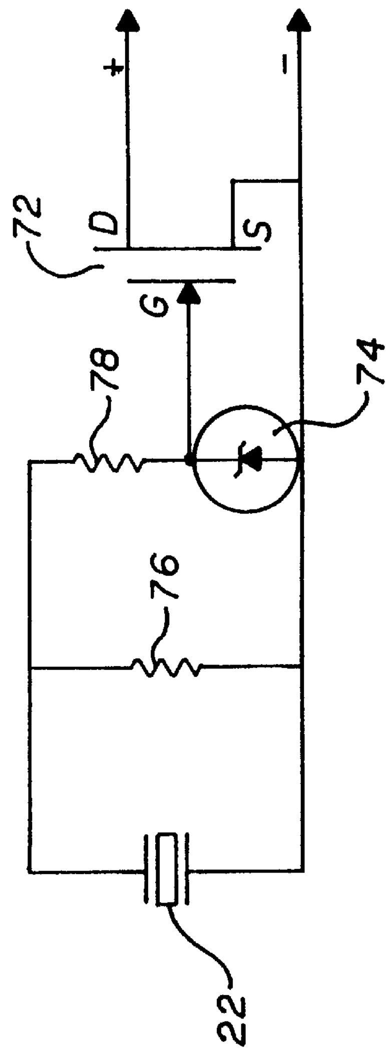
FIGS. 7A and 7B are schematic depictions of switch assemblies according to embodiments of the present invention.

FIG. 7A depicts another embodiment which provides single transistor switching 72 (in addition to the zener diode 74). A number of configurations and values for the various components can be used as will be apparent to those of skill in the art. In one particular embodiment, the first resistor 76 has a value of 22MΩ, second resistor 78 has a value of 10MΩ, the zener diode 74 has characteristics of $V_c$=10V, $I_c$=20mA Zz=17Ω and transistor 72 has characteristics of $R_{DS}$=5 Ω (max on) and $I_{DS}$=200 mA (max).

Figure 7B:
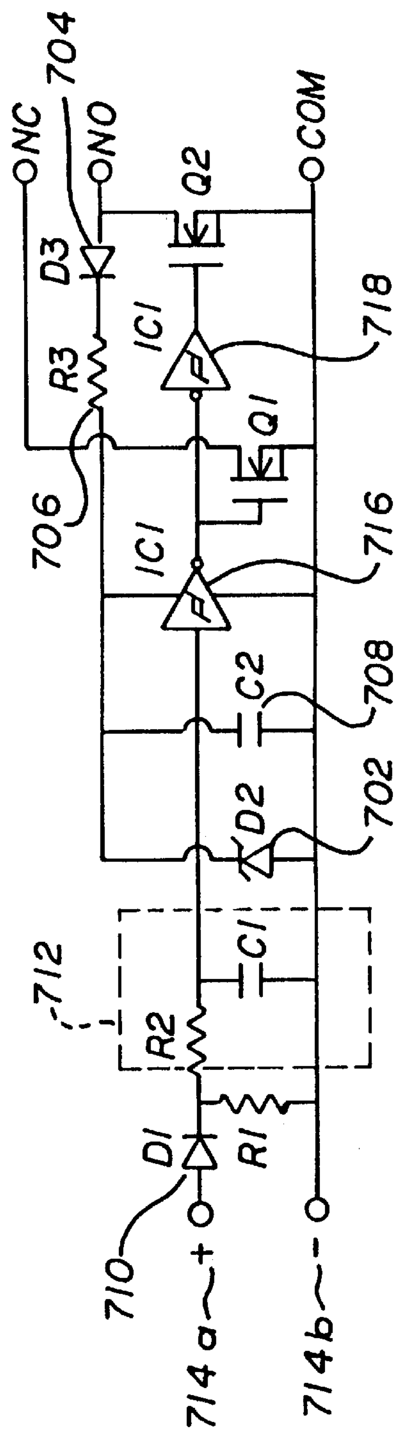

FIG. 7B depicts an embodiment which provides desirable touch characteristics. In the embodiment of FIG. 7B, zener diode 702 and diode 704 along with resistor 706 and capacitor 708 form a 2.2 volt power supply regulator. Diode 710 prevents the discharge of filter 712 during the fall of the crystal output provided at terminals 714*a*, 714*b*. Schmidt Gates 716, 718 provide proper control of hysteresis and reduced voltage operation to gain sensitivity.

FIGS. 8A and 8B depict a housing for the piezoelectric switch assembly according to another embodiment of the present invention. In the embodiment depicted in FIGS. 8A and 8B the light source, such as incandescent bulb 82, is insertable through and held in an opening in a side wall of housing 84 and contains its own electrical plug connectors 86*a*, 86*b* in order to facilitate replacement of a failed bulb 82. The housing is configured to fit within, e.g., a rectangular hole formed in a surface 88, preferably held in place by resilient tabs 92. Preferably the size dimensions and electric plug connectors of the housing are similar to that of the housings for previous devices such as previous mechanical switch devices to facilitate replacement, preferably field replacement, of old switches with the switches of the present invention without the need for modifying or replacing other components. In particular, switches according to one embodiment of the present invention can be installed into the same openings or cutouts, can accommodate the same panel thickness, occupy an interior space equal to or less than current switches and attach to existing harnessing or electrical plugs or connectors.

The relatively low cost of the switch assembly according to the present invention is assisted by the configuration in which piezoelectric film has several functions, including acting as a transducer 24, acting as a substrate and interconnect region for switch components 26 and acting as a trace or connection substrate 28, 32. This simplifies design, manufacture and fabrication by reducing the number of components that must be assembled during manufacture. Additional cost savings are provided by the ability to fabricate a number of transducer/switch components on a single sheet which are later separated e.g., by cutting. In this embodiment, a large sheet of piezoelectric film material is blanked with initial holes and cutouts as depicted, in FIG. 9. For those embodiments in which transparent metalization such as ITO is used, such operation may be done, by selective application or batch application with selective removal. Various conductive traces and regions 34, 38, 39, 42*a*, 42*b*, 42*c* positioned are placed on the two surfaces of the sheet 92 e.g., by silk screening with conductive ink. When reinforcement or spacers are acquired, e.g. in the transducer area 24 these may be laminated in the appropriate areas of the sheet 92. Conductive epoxy is silkscreened or dispensed on the pads 41 for the surface mount transistors or other components 52, 54, 56, 58 and the surface mount components are placed onto the film, e.g. using pick and place equipment and the conductive epoxy is cured. The sheet 92 is then cut into the various transducer/assemblies for installation into the housing, in the position desired.

In light of the above description, a number of advantages of the present invention can be seen. The present invention provides an illuminated switch having a transparent transducer area with the ability to construct a very sensitive transducer and, simultaneously, the ability to have the transducing material act as the interconnections and circuit substrate. The switch assembly is easy to construct and manufacture, particularly in volume production mode and provides low cost. The present invention has a long operating life preferably providing for at least about ten million actuations before failure. Preferably the switch can endure electrostatic discharge testing per IEC801-2.

A number of variations and modifications of the present invention can also be used. Although certain circuit configurations for converting the charge generated by the piezoelectric film into a switch activation have been described, other circuits can also be used as will be apparent to those of skill in the art after understanding the present invention, such as circuits that use transistors other than MOSFET transistors, circuits that have different or additional filtering, circuits with faster and/or slower response times, latching circuits, hardened circuits and the like. It is possible to use some aspects of the invention without using other aspects. For example, it is possible to achieve the benefits of low cost provided by the multi-function aspect of the piezoelectric film, without using the transparent feature and/or without providing an illuminated switch. Although the present invention provides the opportunity for reducing or eliminating parts with relative motion, it is possible to use a piezoelectric film as both a transducer and circuit switch circuit substrate while still providing relative motion in some portions of the switch. Components can be placed on the film other than by conductive epoxy such as by low temperature reflow solder. Conductive traces can be formed other than by silk screening with conductive ink such as by printing ITO or selective metalization. Although, in one embodiment, a separate piezoelectric film is provided for each switch, it is possible to have several switches on a single panel made of one (or more) film assembly. In this embodiment, sensitive switch areas of various geometries, one or more of which being at least partially illuminated by one or more light sources, and each with its associated circuitry, are formed on a single piezoelectric film, with the various switches coupled to one or more connectors. Although SPST and SPDT switches were described above, double pole single throw (DPST) and double pole double throw (DPDT) switches can also be provided using the present invention, e.g. by using a transducer to drive two switch circuits in a manner which will be apparent to those of skill in the art upon understanding the present invention.

Although the present invention has been defined by way of a preferred embodiment and certain variations and modifications, other variations and modifications can also be used, the invention being defined by the following claims.

What is claimed is:

1. A switch assembly comprising:

a user activation surface for permitting a user to change the state of said switch by pressing said surface, said user activation surface being transparent or translucent;

a flexible piezoelectric film with first and second surfaces, having at least a first substantially light-conductive region, aligned with at least a portion of said user activation surface, wherein strain produced by flexing of said first region of said piezoelectric film in response to said pressing of said user activation surface by said user produces an electric charge;

an electronic switch device which is either in a first or a second state, one of said first and second states being a substantially conductive state, and the other of said first and second states being a substantially non-conductive state, said electronic switch including at least a first component mounted on a portion of one of said first and second surfaces of said flexible piezoelectric film spaced from said first region wherein said first component is selected from the group consisting of a transistor, a diode and a discrete capacitor;

at least a first conductor coupling said first region with said electronic switch, wherein said electric charge produced by said flexing results in said electronic switch changing from said first state to said second state in the absence of using charge produced by flexing a second region of said film for changing state of a second switch; and a light source positioned to transmit light through said first region of said piezoelectric film to illuminate said user activation surface.

2. A switch assembly, as claimed in claim 1, wherein said electronic switch is a single pole double throw switch.

3. A switch assembly as claimed in claim 1, wherein said switch is activatable substantially in the absence of relative movement of switch components other than that of said piezoelectric film.

4. A switch assembly as claimed in claim 1, wherein said conductor comprises a conductive trace formed on a surface of said piezoelectric film.

5. A switch assembly comprising:

a flexible piezoelectric film with first and second surfaces, having at least a first region, wherein strain produced by flexing of said first region of said piezoelectric film produces an electric charge;

a passive electronic double throw switch device which is either in a first or a second state, one of said first and second states being a substantially conductive state, and the other of said first and second states being a substantially non-conductive state, said switch device defining at least a normally open node and a common node, wherein said electronic switch device includes a normally open first switch and an output terminal coupled to a normally-closed second switch, said switch device configured to operate using only said electric charge produced by flexing of said first region of said piezoelectric film and a potential between said normally open node and said common node of said switch device, wherein said electric charge causes closing of said first switch and said closing of said first switch causes opening of said second switch; and at least a first conductor coupling said first region with said electronic switch, wherein said electric charge produced by said flexing results in said electronic switch device changing from said first state to said second state.

6. A switch assembly as claimed in claim 5 wherein at least one of said first and said second switch comprises a transistor.

7. A switch assembly as claimed in claim 1 wherein at least a portion of said first region is substantially free from a conductive coating.

8. A switch assembly as claimed in claim 1 wherein said first region is at least partially coated with a light-transmitting conductive coating.

9. A switch assembly, as claimed in claim 1, further comprising:

a housing substantially enclosing said film, said electronic switch and said light source;

an electrical connector extending through a portion of said housing and contacting said piezoelectric film; and a conductive trace on said piezoelectric film coupling said electronic switch with said electrical connector.

10. A switch assembly comprising:

a user activation surface for permitting a user to charge the state of said switch by pressing said surface, said user activation surface being transparent or translucent;

a flexible piezoelectric film with first and second surfaces, having at least a first substantially light-conductive region, aligned with at least a portion of said user activation surface, wherein strain produced by flexing of said first region of said piezoelectric film in response to said pressing of said user activation surface by said user produces an electric charge;

switch means which is either in a first or a second state, one of said first and second states being a substantially conductive state, and the other of said first and second states being a substantially non-conductive state, said switch means including at least one of a transistor, a diode and a discrete capacitor, and being mounted on a portion of one of said first and second surfaces of said flexible piezoelectric film spaced from said first region;

at least a first conductive trace coupling said first region with said switch means, wherein said electric charge produced by said flexing results in said switch means changing from said first state to said second state in the absence of using charge produced by flexing a second region of said film for changing state of a second switch; and means for transmitting light through said first region of said piezoelectric film to illuminate said user activation surface.

11. A method for electrical switching comprising:

mounting a first charge-responsive switch on a light-transmissive piezoelectric film, said charge-responsive switch including at least one of a transistor, a diode and a discrete capacitor;

flexing a first region of said film to create a charge sufficient to change the state of said first switch in the absence of using charge produced by flexing a second region of said film for changing state of a second switch; and shining light from a light source through a portion of said piezoelectric film.

12. A method for fabricating a piezoelectric switch comprising:

providing a flexible piezoelectric film having at least a first substantially light conductive region;

mounting an electronic switch on a portion of said flexible piezoelectric film, spaced from said first region, said electronic switch including at least one of a transistor, a diode and a discrete capacitor, wherein said electronic switch is either in a first or second state, one of said first and second states being a substantially conductive state and the other of said first and second states being a substantially non-conductive state;

providing at least a first conductive trace coupling said first region with said electronic switch;

providing a housing, said housing including a means for mounting a light-conductive activation surface;

positioning a light source configured to transmit light through at least a portion of said housing;

positioning said first portion of said piezoelectric film within said housing, between said light source and said activation surface wherein an electric charge developed in said first region of said piezoelectric film in response to said activation of said activation surface is provided to said switch to change said switch from said first state to said second state without the need to couple said first region to said switch external to said piezoelectric film and in the absence of using charge produced by flexing a second region of said film for changing state of a second switch.

13. A method, as claimed in claim 12, further comprising:

coupling the output of said electronic switch to a first electrical connector mounted on said housing without the need for coupling said switch to said connector external to said piezoelectric film.

14. A switch assembly, as claimed in claim 1, wherein said flexible piezoelectric film has at least a second region and wherein at least a portion of a second electronic switch is coupled to said second region by a second conductive trace.

15. A switch assembly, as claimed in claim 14, further comprising a housing substantially enclosing said film, an electrical connector extending through a portion of said housing and contacting said piezoelectric film, a third conductive trace on said piezoelectric film coupling said electronic switch to said electrical connector and a fourth conductive trace on said piezoelectric film coupling said second switch to said electrical conductor.

16. A switch assembly comprising:

a switch activation surface;

a flexible piezoelectric film with first and second surfaces, having at least a first substantially light-conductive region, wherein strain produced by flexing of said first region of said piezoelectric film in response to user activation of said activation surface produces an electric charge;

an electronic switch which is either in a first or a second state, one of said first and second states being a substantially conductive state, and the other of said first and second states being a substantially non-conductive state, said electronic switch being mounted on said film and including at least one of a transistor, a diode and a discrete capacitor;

at least a first conductive trace formed on a surface of said piezoelectric film coupling said first region with said electronic switch, wherein said electronic switch operates solely in response to electric charge produced by said flexing, resulting in said electronic switch changing from said first state to said second state in the absence of using charge produced by flexing a second region of said film for changing state of a second switch; and a light source, wherein said first region of said piezoelectric film is positioned between said activation surface and said light source, to permit said light source to transmit light through said first region of said piezoelectric film to illuminate said activation surface.

17. A switch assembly as claimed in claim 16, wherein said electronic switch includes a normally-open first switch and a normally-closed second switch, wherein said electric charge causes closing of said first switch and said closing of said first switch causes opening of said second switch.

18. A switch assembly as claimed in claim 16, wherein said electronic switch is provided in the absence of mounting said switch on a rigid printed circuit board.

19. A switch assembly as claimed in claim 16, wherein said electronic switch is a switch of a type other than a single pole, double throw switch.

20. A switch assembly as claimed in claim 5 wherein said first region is substantially light-transmissive and further comprising a light source positioned to transmit light through said first region.

* * * * *